United States Patent
Lee

(10) Patent No.: US 9,659,617 B2
(45) Date of Patent: May 23, 2017

(54) CLOCK CONTROL DEVICE

(71) Applicant: SK hynix Inc., Icheon-si, Gyeonggi-do (KR)

(72) Inventor: Dong Beom Lee, Icheon-si (KR)

(73) Assignee: SK hynix Inc., Icheon-Si (KR)

(*) Notice: Subject to any disclaimer, the term of this patent is extended or adjusted under 35 U.S.C. 154(b) by 0 days.

(21) Appl. No.: 14/992,614

(22) Filed: Jan. 11, 2016

(65) Prior Publication Data

US 2017/0110168 A1 Apr. 20, 2017

(30) Foreign Application Priority Data

Oct. 16, 2015 (KR) .................. 10-2015-0144981

(51) Int. Cl.
*H03K 3/356* (2006.01)
*G11C 7/22* (2006.01)
*G11C 7/08* (2006.01)
*G11C 7/10* (2006.01)

(52) U.S. Cl.
CPC .............. *G11C 7/222* (2013.01); *G11C 7/08* (2013.01); *G11C 7/109* (2013.01); *G11C 7/1063* (2013.01)

(58) Field of Classification Search
CPC ................................... H03K 3/356
USPC .......................................... 327/149
See application file for complete search history.

(56) References Cited

U.S. PATENT DOCUMENTS

| | | | | |
|---|---|---|---|---|
| 5,966,037 A * | 10/1999 | Truong | ............... | H03K 5/1515 327/239 |
| 6,668,335 B1 * | 12/2003 | Breach | ............... | H04L 45/00 709/237 |
| 2002/0093368 A1 * | 7/2002 | Fulkerson | ............ | H03K 3/012 327/203 |
| 2005/0008111 A1 * | 1/2005 | Suzuki | ............... | H03L 7/089 375/371 |
| 2007/0291576 A1 * | 12/2007 | Yang | ............... | G11C 7/1039 365/230.08 |
| 2008/0054958 A1 * | 3/2008 | Liu | ............... | H03L 7/0814 327/149 |
| 2008/0074151 A1 * | 3/2008 | Kim | ............... | H03K 5/1534 326/94 |
| 2011/0001532 A1 * | 1/2011 | Seo | ............... | H03K 5/1565 327/175 |
| 2014/0266365 A1 * | 9/2014 | Penzes | ............... | H03K 3/012 327/203 |
| 2015/0102838 A1 | 4/2015 | Baek et al. | | |

* cited by examiner

*Primary Examiner* — Min Huang
(74) *Attorney, Agent, or Firm* — William Park & Associates Ltd.

(57) ABSTRACT

A clock control device is disclosed, which relates to a technology for changing a rising or falling edge trigger. The clock control device includes: a flip-flop configured to latch data in response to a delay clock signal; and a clock controller configured to output the delay clock signal by delaying a clock signal, and control the data to be triggered at a falling edge of the clock signal when the clock signal is input at a time earlier than the data.

9 Claims, 10 Drawing Sheets

CLOCK CONTROL DEVICE

CROSS-REFERENCE TO RELATED APPLICATION

This application claims priority under 35 U.S.C. §119(a) to Korean patent application No. 10-2015-0144981, filed on Oct. 16, 2015, the disclosure of which is hereby incorporated in its entirety by reference herein.

BACKGROUND OF THE INVENTION

1. Technical Field

Embodiments of the present disclosure relate to a clock control device, and more particularly to a technology for changing a rising or falling edge trigger.

2. Related Art

Digital Large Scale Integrated circuits (hereinafter referred to as LSIs) such as microprocessors have generally been highly integrated. Most constituent circuits of a digital LSI may include synchronous sequential circuits, each of which includes one or more flip-flops and a logic gate configured to perform a logic operation of data between the flip-flops.

An edge-triggered flip-flop may be used in the above sequential circuit. The edge-triggered flip-flop may update output signals by operating in the rising edge of a common clock signal.

Meanwhile, a semiconductor memory device such as a Dynamic Random Access Memory (DRAM) may include a memory array having a plurality of memory cells storing data therein.

Specifically, a synchronous DRAM (SDRAM) from among DRAMs may be synchronized with an external clock signal, such that the SDRAM may perform the read/write operations. Therefore, the SDRAM may synchronize data with an edge of a clock signal, and may perform read and write operations, resulting in an implementation of high-speed data transmissions.

In this case, assuming that SDRAM operates at the rising part of the clock voltage, this means that the SDRAM operates at the rising edge. Assuming that SDRAM operates at the falling part of the clock voltage, this means that the SDRAM operates at the falling edge.

However, a conventional clock control device may have difficulty in adjusting a delay of the clock signal. When delay adjusting is performed to minimize a skew of a clock signal, a conventional clock control device can perform the delay adjusting by trial and error so as to synchronize data with an input clock signal using a buffer configured to perform such delay adjusting. As a result, much time is taken to perform the delay adjusting by the conventional clock control device, resulting in reduction of product productivity.

BRIEF SUMMARY OF THE INVENTION

Various embodiments of the present disclosure are directed to providing a clock control device that substantially obviates one or more problems due to limitations and disadvantages of the related art.

Embodiments of the present disclosure relate to a clock control device for changing the rising or falling edge trigger so as to accurately control a trigger time of data.

In accordance with an embodiment of the present disclosure, a clock control device includes: a flip-flop configured to latch data in response to a delay clock signal; and a clock controller configured to output the delay clock signal by delaying a clock signal, and control the data to be triggered at a falling edge of the clock signal when the clock signal is input at a time earlier than the data.

In accordance with another embodiment of the present disclosure, a clock control device includes: a flip-flop configured to latch data in response to a delay clock signal; and a clock controller configured to output the delay clock signal by delaying a clock signal, and control the data in response to a test signal in a manner that the data is triggered at the rising or falling edge of the clock signal.

It is to be understood that both the foregoing general description and the following detailed description of the present disclosure are exemplary and explanatory and are intended to provide further explanation of embodiments as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Figure 1:
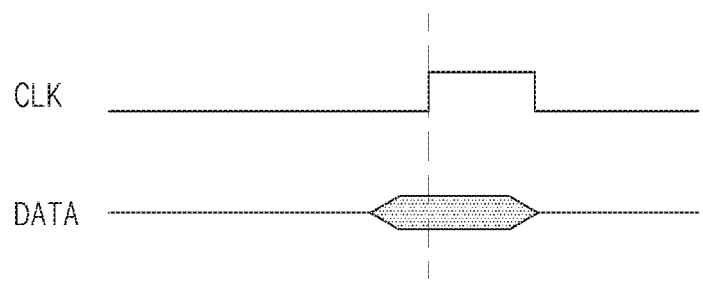
FIGS. 1 to 3 are conceptual diagrams illustrating a skew phenomenon of clock and data.
Figure 2:
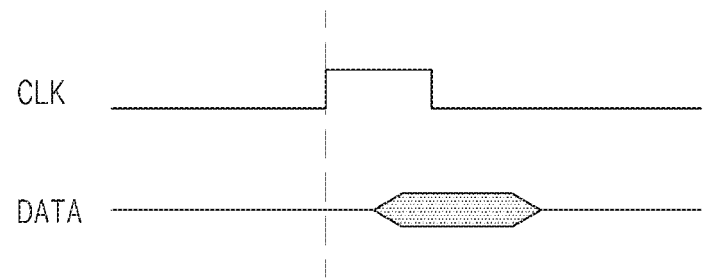
Figure 3:
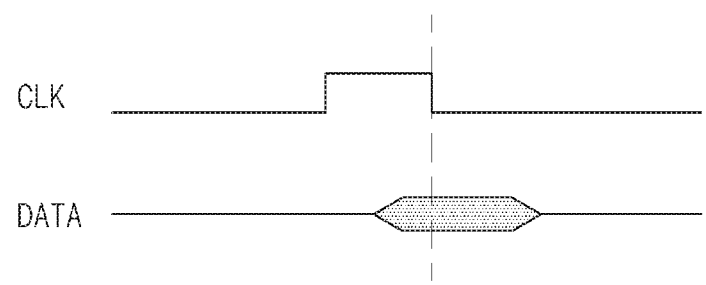

FIGS. 1 to 3 are conceptual diagrams illustrating a skew phenomenon of clock and data.

Data (DATA) may be triggered at the edge of a clock signal (CLK). However, a line length may be increased in a layout structure, or a skew between the clock signal (CLK) and data (DATA) may occur in the circuit. As a result, an unexpected case in which data (DATA) is not triggered with the edge of the clock signal (CLK) may occur.

In order to clearly adjust the trigger time, a layout structure of a conventional clock control device is changed such that an inverter is added to or subtracted from a circuit of the conventional clock control device. However, since a process for changing the layout structure is contained in the above layout change method, the layout change method may be far from efficient. In erroneous circuits of each chip, the data (DATA) and the clock signal (CLK) have different time points, such that it is impossible to simultaneously change the time points of the clock signals (CLK) of the erroneous circuits.

FIGS. 1 and 2 are conceptual diagrams illustrating a skew between the clock signal (CLK) and data (DATA) that occurs in a logic circuit configured to trigger data to the rising edge of the clock signal (CLK).

In a normal case, data (DATA) is first input and the clock signal (CLK) is then input as shown in FIG. 1, such that the data (DATA) can be triggered at the rising edge of the clock signal (CLK). However, the clock signal (CLK) becomes faster as shown in FIG. 2, such that the clock signal (CLK) may be input at an earlier time than the data (DATA).

In this case, undesired data may be triggered at the rising edge of the clock signal (CLK). Therefore, a path of a signal line of the logic circuit may be changed, or a delay may be added such that the skew may be solved.

However, assuming that the above-mentioned skew occurs upon completion of the logic circuit layout, a user of the logic circuit must modify the layout structure, resulting in user inconvenience and an increased logic implementation time.

Therefore, embodiments of the present disclosure can solve the skew of the clock signal (CLK) in the same manner as in FIG. 3.

That is, if the clock signal (CLK) is input at an earlier time than the data (DATA) because the clock signal (CLK) becomes faster as shown in FIG. 3, the data (DATA) may be triggered by synchronizing with the falling edge of the clock signal (CLK). As a result, embodiments of the present disclosure can switch the clock triggering scheme upon completion of the layout, such that desired data can be triggered.

Figure 4:
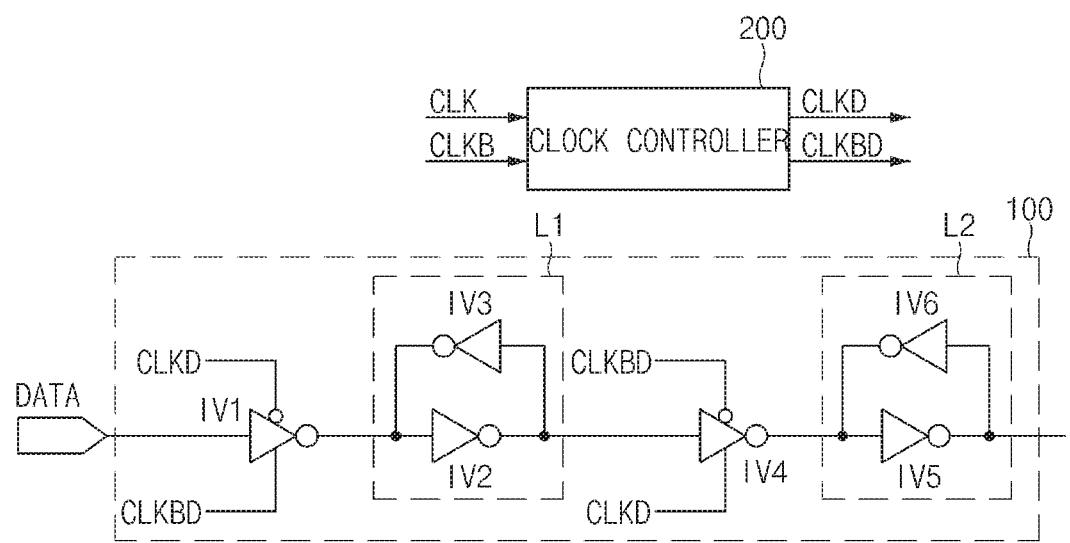
FIG. 4 is a circuit diagram illustrating a clock control device according to an embodiment of the present disclosure.

FIG. 4 is a circuit diagram illustrating a clock control device according to an embodiment of the present disclosure.

Referring to FIG. 4, the clock control device according to the embodiment may include a flip-flop 100 and a clock controller 200.

In this case, the flip-flop 100 may perform flip-flopping on data (DATA) by synchronizing with delay clock signals (CLKD, CLKBD). In one particular embodiment, the flip-flop 100 may latch data (DATA) in response to at least one delay clock signal (CLKD, CLKBD). The flip-flop 100 may include inverters (IV1, IV4) and latch units (L1, L2).

The inverter IV1 may inversion-drive the data (DATA) by synchronizing with the delay clock signals (CLKD, CLKBD). In this case, a delay clock (CLKD) may be opposite in phase to the other delay clock (CLKBD). That is, assuming that the delay clock signal (CLKD) of the inverter IV1 is at a low level and the delay clock signals (CLKD, CLKBD) are at a high level, data (DATA) may be output to the latch unit L1. Further, when the delay clock signal (CLKD) is at a low level, the inverter IV1 may invert the data (DATA).

The latch unit L1 may latch the output signal of the inverter IV1. The latch unit L1 may include inverters (IV2, IV3) having input/output (I/O) terminals coupled to each other.

The inverter IV4 may inversion-drive data (DATA) by synchronizing with the delay clock signals (CLKBD, CLKD). In this case, the inverter IV4 and the inverter IV1 may operate in a complementary manner. That is, if the delay clock (CLKD) is at a high level and the delay clock signals (CLKD, CLKBD) are at a low level, the inverter IV4 may invert an output signal of the latch unit L1 and output data (DATA) to the latch unit L2.

The latch unit L2 may latch the output signal of the inverter IV4. The latch unit L2 may include inverters (IV5, IV6) in which I/O terminals are coupled to each other.

In addition, the clock controller 200 may delay the clock signals (CLK, CLKB) for a predetermined time, may optionally change a phase of the delay clock signals (CLKD, CLKBD), and may output the resultant delay clock signals (CLKD, CLKBD) each having a phase changed to the flip-flop 100. In this case, the delay clock signals (CLKD, CLKBD) may be obtained by delaying the clock signals (CLK, CLKB) for a predetermined time. Further, in one example, the clock signal CLKB is an inversion signal of the clock signal CLK, and the delay clock signal CLKDB may be an inversion signal of the delay clock signal CLKD.

The embodiment of the present disclosure may control the clock controller 200 to optionally switch the phase of the delay clock signals (CLKD, CLKBD) after completion of the layout of the circuit logic, such that trigger time points of the clock signals (CLK, CLKB) are controlled.

For example, assuming that the delay clock signal (CLKD) is at a low level, the latch unit L1 may latch the data (DATA) received through the inverter IV1. In contrast, assuming that the delay clock signal (CLKD) is at a high level, the latch unit L2 may latch data (DATA) received through the inverter IV4.

In accordance with the embodiment, if the clock signal (CLK) applied to the flip-flop 100 is faster or earlier than the data (DATA), the data (DATA) may be triggered at the falling edge of the clock signal (CLK). That is, if the data (DATA) is not synchronized with the rising edge of the clock signal (CLK), the data (DATA) is triggered to be synchronized with the falling edges of the clock signals (CLKD, CLKBD), such that desired data can be read.

The above-mentioned embodiment may modify the clock (CLK) triggering scheme such that the clock triggering can be switched from the rising edge to the falling edge of the clock signal (CLK) through short-circuiting.

Figure 5:
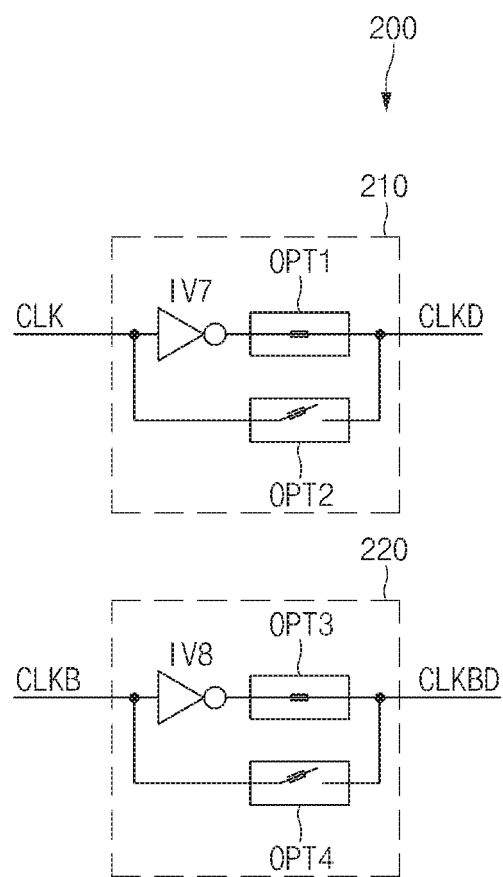
FIG. 5 is a circuit diagram illustrating a clock controller shown in FIG. 4 according to an embodiment of the present disclosure.

FIG. 5 is a circuit diagram illustrating the clock controller 200 shown in FIG. 4 according to an embodiment of the present disclosure.

Referring to FIG. 5, the clock controller 200 may include an option unit 210 and an other option unit 220.

In this case, the option unit 210 may invert the phase of the clock signal (CLK) and then output the delay clock signal (CLKD), or may bypass the phase of the clock signal (CLK) and output the bypassed result as the delay clock signal (CLKD) without change.

In this case, the option unit 210 may include an inverter IV7 and the option units (OPT1, OPT2). The inverter IV7 may inversion-drive the clock signal (CLK) to invert the clock signal (CLK), and output the inversion-driven result to the option unit OPT1. The option unit (OPT1) may interconnect the inverter IV7 and the delay clock signal (CLKD). If the option unit (OPT1) is coupled to the option unit 210, the option unit 210 may output the output signal of the inverter IV7 as the delay clock signal (CLKD). In addition, if the option unit (OPT2) is short-circuited, an input path line of the clock signal (CLK) is cut off. Thus, the option unit (OPT2) may interconnect the clock signal (CLK) and the delay clock signal (CLKD). [claim 8]

For example, the data (DATA) may be scheduled to be triggered at the falling edge of the clock signal (CLK). Thus, the option unit (OPT1) is connected and a connection line of the other option unit (OPT2) is cut off. In this case, the phase of the clock signal (CLKD) is inverted by the inverter IV7, and the clock signal (CLKD) is synchronized with the falling edge of the flip-flop 100, such that data (DATA) is triggered.

The option unit 220 may invert the phase of the clock signal (CLKB) to output the delay clock signal (CLKBD), or may bypass the phase of the clock signal (CLKB) and output the bypassed result as the delay clock signal (CLKBD) without change.

The option unit 220 may include an inverter IV8 and the option units (OPT3, OPT4). The inverter IV8 may inversion-drive the clock signal (CLKB) to invert the clock signal (CLKB), and output the inversion-driven result to the option unit (OPT3). If the option unit (OPT3) is connected, the option unit (OPT3) may interconnect the inverter IV8 and the delay clock signal (CLKBD) such that the output signal of the inverter IV3 may be output as the delay clock signal (CLKBD). In addition, if the option unit (OPT4) is cut off, the input path line of the clock signal (CLKB) is cut off. Also, the option unit (OPT4) may interconnect the clock signal CLKB and the delay clock signal CLKDB when the option unit (OPT3) is cut off and the option unit (OPT4) is connected.

For example, the data (DATA) may be scheduled to be triggered at the falling edge of the clock signal (CLKB). Thus, the option unit (OPT3) is connected and a connection line of the other option unit (OPT4) is cut off. In this case, the phase of the clock signal (CLKBD) is inverted by the inverter IV8, and the clock signal (CLKBD) is synchronized with the falling edge of the flip-flop 100, such that data (DATA) is triggered.

As described above, the option units (OPT1, OPT3) and the option units (OPT2, OPT4) may be operated in a complementary manner. If the option units (OPT1, OPT3) are connected, the flip-flop 100 may operate using the delay clock signals (CLKD, CLKBD) in which the clock signals (CLK, CLKB) are inverted. Therefore, the flip-flop 100 may be synchronized with the falling edge of the clock signal (CLK) so that data (DATA) is triggered.

In contrast, when the option units (OPT2, OPT4) are connected, the flip-flop 100 may operate using the delay clock signals (CLKD, CLKBD) obtained by bypassing the clock signals (CLK, CLKB) without change. Therefore, the flip-flop 100 may be synchronized with the rising edge of the clock signal (CLK) such that data (DATA) is triggered.

The embodiment may switch the trigger scheme of the clock signal (CLK) from the rising trigger scheme to the falling trigger scheme through connection states of the option units (210, 220), such that it can trigger desired data.

Figure 6:
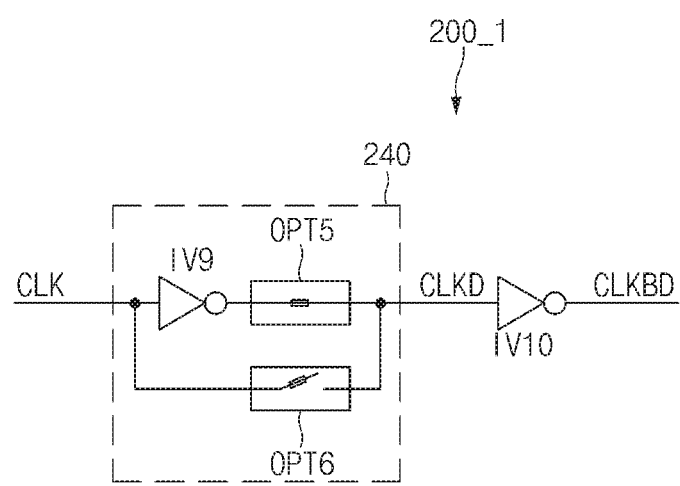
FIG. 6 is a circuit diagram illustrating a clock controller shown in FIG. 4 according to another embodiment of the present disclosure.

FIG. 6 is a circuit diagram illustrating the clock controller 200 shown in FIG. 4 according to another embodiment of the present disclosure.

Referring to FIG. 6, the other embodiment of the clock controller 200 may be denoted by a reference numeral (200_1).

The clock controller (200_1) may include an inverter IV10. In this case, the option unit 240 may include an inverter IV9 and the option units (OPT5, OPT6). The inverter IV9 may inversion-drive the clock signal (CLK) to invert the clock signal (CLK) and output the inversion-driven result to the option unit (OPT5).

The option unit (OPT5) may interconnect the inverter IV9 and the delay clock signal (CLKD). When the option unit (OPT5) is connected, the output signal of the inverter IV9 may be output as the delay clock signal (CLKD). The option unit (OPT6) may be configured to interconnect the clock signal (CLK) and delay clock signal (CLKD).

In addition, when the option unit (OPT6) is connected, the clock signal (CLK) may be output as the delay clock signal (CLKD) without change.

For example, the data (DATA) may be triggered at the falling edge of the clock signals (CLK, CLKB). Thus, the option unit (OP5) is connected and the other option unit (OPT6) is cut off. The inverter IV10 may inversion-drive the delay clock signal (CLKD) to invert a phase of the delay clock signal (CLKD) and then output the inversion-driven result to the delay clock signal (CLKBD).

As described above, if the option unit (OPTS) is connected, the delay clock signal (CLKD) obtained by inverting the phase of the clock signal (CLK) may be output. The flip-flop 100 may operate by the delay clock signal (CLKBD) obtained by inverting the phase of the delay clock signal (CLKD). As a result, the flip-flop 100 may be synchronized with the falling edge of the clock signal (CLK) and thus trigger data (DATA).

In contrast, if the option unit (OPT6) is connected, the option unit (OPT6) may output the delay clock (CLKD) obtained by bypassing the phase of the clock signal (CLK) without change. The flip-flop 100 may operate in accordance with the delay clock signal (CLKBD) obtained by inverting the phase of the delay clock signal (CLKD). Therefore, the flip-flop 100 may be synchronized with the rising edge of the clock signal (CLK) so that the flip-flop 100 can trigger data (DATA).

The embodiment may switch the trigger scheme of the clock signal (CLK) from the rising trigger scheme to the falling trigger scheme through the connection state of the option unit 240, such that desired data can be triggered.

Figure 7:
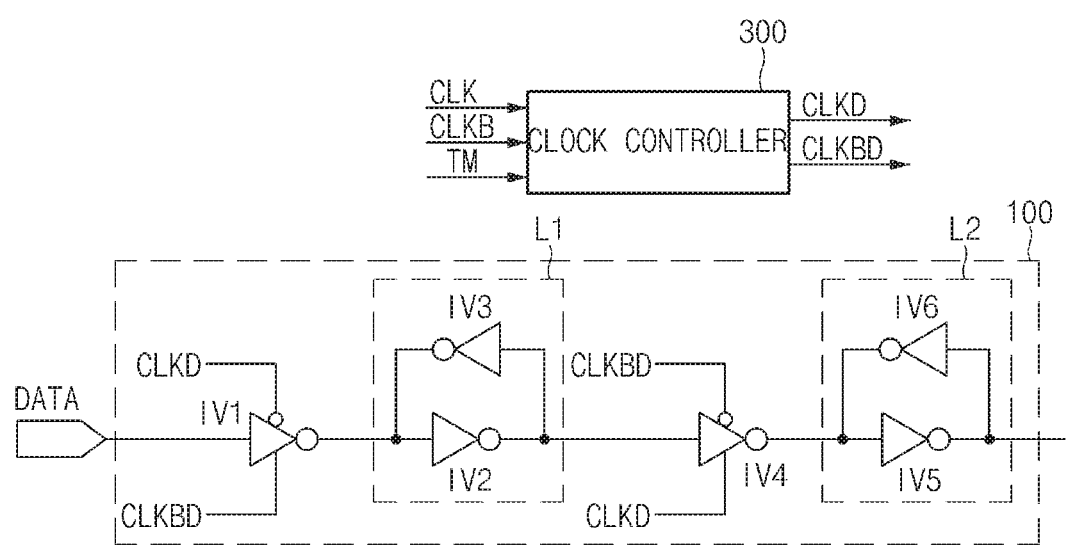
FIG. 7 is a circuit diagram illustrating a clock control device according to another embodiment of the present disclosure.

FIG. 7 is a circuit diagram illustrating a clock control device according to another embodiment of the present disclosure.

Referring to FIG. 7, the clock control device may include a flip-flop 100 and a clock controller 300. The structure and operation of the flip-flop 100 shown in FIG. 7 are identical to those of FIG. 4, thus only the structure and operation of the clock controller 300 will hereinafter be described with reference to FIG. 7.

The clock controller 300 may delay the clock signals (CLK, CLKB) for a predetermined time, output or change a phase of the delay clock signals (CLKD, CLKBD) in response to a test signal (TM), and then output the resultant delay clock signals (CLKD, CLKBD) to the flip-flop 100. In this case, the delay clock signals (CLKD, CLKBD) may be obtained by delaying the clock signals (CLK, CLKB) for a predetermined time. Further, the clock signal (CLKB) may be an inversion of clock signal (CLK). Also, the delay clock signal (CLKDB) may be an inversion of the delay clock signal (CLKB).

That is, the clock control device according to an embodiment of the present disclosure may control the clock controller 300 to output or switch the phase of the delay clock signals (CLKD, CLKBD) through the test signal (TM) after completion of the circuit logic layout, such that the clock controller 300 can control the trigger time points of the clock signals (CLK, CLKB).

For example, if the delay clock signal (CLKD) is at a low level, data (DATA) received through the inverter IV1 may be inverted and/or may be latched by the latch unit L1. In contrast, if the delay clock signal (CLKD) is at a high level, data (DATA) received through the inverter IV4 may be latched by the latch unit L2. Further, if the delay clock signal (CLKD) is at a high level, the inverter IV4 may invert the data (DATA) of the latch unit L1.

In accordance with the embodiment, if the clock signal (CLK) applied to the flip-flop 100 is faster than data (DATA), the data (DATA) may be triggered at the falling edge of the clock signal (CLK). That is, if the data (DATA) is not synchronized with the rising edge of the clock signal (CLK), data (DATA) is triggered to be synchronized with the falling edges of the clock signals (CLKD, CLKBD), such that the desired data can be read.

In addition, assuming that data (DATA) is synchronized with the rising edge of the clock signal (CLK), the data (DATA) may be triggered to be synchronized with the rising edge of the clock signals (CLKD, CLKBD) without change.

The above-mentioned embodiment may control the data (DATA) in response to the test signal TM by switching the clock (CLK) triggering scheme through the test signal (TM), such that the data (DATA) can be triggered at the rising or falling edge of the clock signal (CLK) through the test signal (TM).

Figure 8:
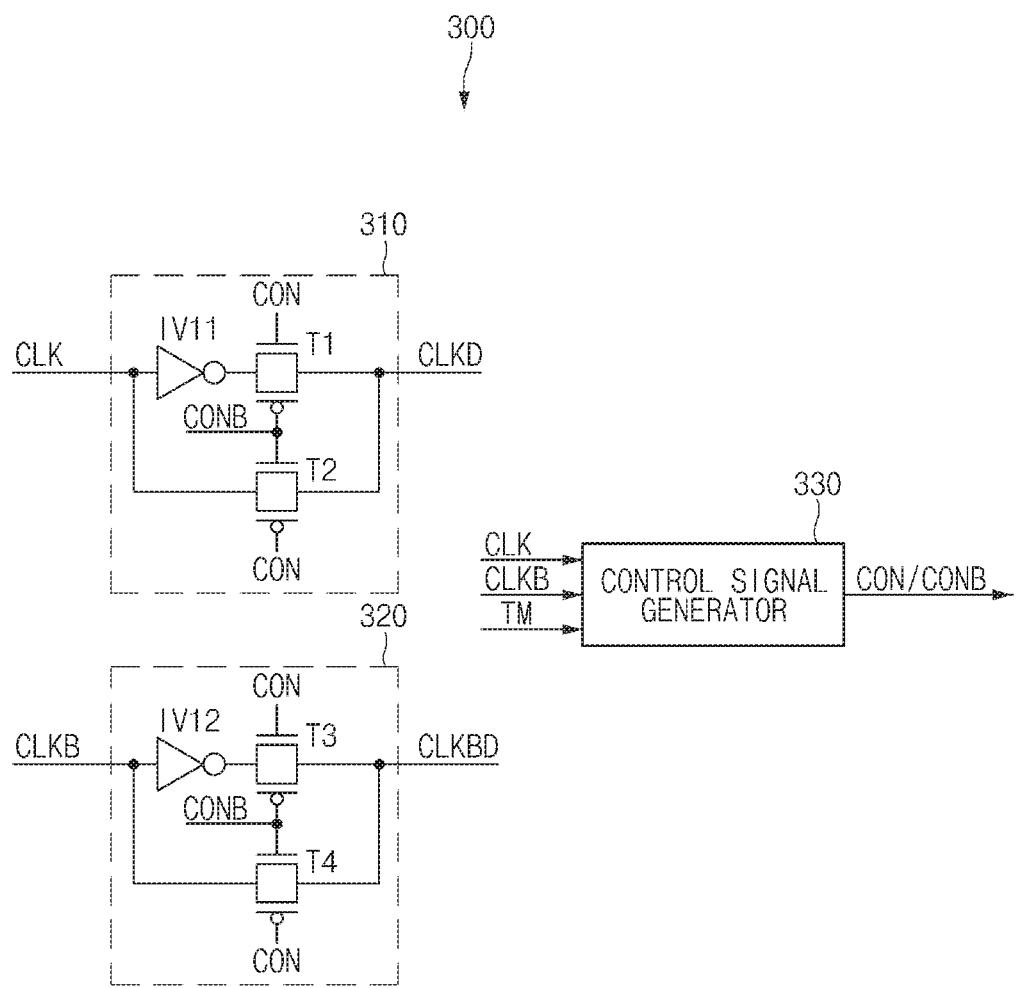
FIG. 8 is a circuit diagram illustrating a clock controller shown in FIG. 7 according to an embodiment of the present disclosure.

FIG. 8 is a circuit diagram illustrating the clock controller 300 shown in FIG. 7 according to an embodiment of the present disclosure.

Referring to FIG. 8, the clock controller 300 may include trigger controllers (310, 320) and a control signal generator 330.

The trigger controller 310 may control a phase of the clock signal (CLK) in response to the control signals (CON, CONB), such that the trigger controller 310 may output the delay clock signal (CLKD). In this case, the control signal (CONB) may be obtained by inverting the control signal (CON).

The trigger controller 310 may include an inverter IV11 and transfer gates (T1, T2). The transfer gate T1 and the other transfer gate T2 may be operated in a complementary manner.

The inverter IV11 may inversion-drive the clock signal (CLK) to invert the first clock signal (CLK), and output the inversion-driven result to the transfer gate T1. The transfer gate T1 may be switched by the control signals (CON, CONB) such that the transfer gate T1 may output the output signal of the inverter IV11 as the delay clock signal (CLKD) in response to at least one of the control signals (CON, CONB). The transfer gate T1 may receive the control signal (CON) through an NMOS gate, and may receive the other control signal (CONB) through a PMOS gate.

Therefore, if the control signal (CON) is at a high level, the transfer gate T1 may be turned on. If the control signal (CON) is at a low level, the transfer gate T1 may be turned off.

In addition, the transfer gate T2 may be switched by the control signals (CON, CONB) such that the clock signal (CLK) may be output as the delay clock signal (CLKD) without change in response to an inversion of at least one of the control signals (CON, CONB). The transfer gate T2 may receive the control signal (CONB) through the NMOS gate, and may receive the other control signal (CON) through the PMOS gate.

Therefore, if the control signal (CON) is at a low level, the transfer gate T2 may be turned on. If the control signal (CON) is at a high level, the transfer gate T2 may be turned off.

For example, if the control signal (CON) is at a high level and the control signal (CONB) is at a low level, the transfer gate T1 may be turned on and the transfer gate T2 may be turned off. In contrast, if the control signal (CON) is at a low level and the control signal (CONB) is at a high level, the transfer gate T2 may be turned on and the transfer gate T1 may be turned off.

The trigger controller 320 may control a phase of the clock signal (CLKB) in response to one or both the control signals (CON, CONB), and thus output the delay clock signal (CLKBD).

The trigger controller 320 may include an inverter IV12 and the transfer gates (T3, T4). The transfer gate T3 and the other transfer gate T4 may be operated in a complementary manner.

The inverter IV12 may inversion-drive the clock signal (CLKB) to invert the second clock signal (CLKB) and output the inversion-driven result to the transfer gate T3. The transfer gate T3 may be switched by the control signals (CON, CONB), and may output the output signal of the inverter IV12 as the delay clock signal (CLKBD) in response to at least one of the control signals (CON, CONB). The transfer gate T3 may receive the control signal (CON) through an NMOS gate, and may receive the other control signal (CONB) through a PMOS gate.

Therefore, if the control signal (CON) is at a high level, the transfer gate T3 may be turned on. If the control signal (CON) is at a low level, the transfer gate T3 may be turned off.

In addition, the transfer gate T4 may be switched by the control signals (CON, CONB) such that the transfer gate T4 may output the clock signal (CLKB) as the delay clock signal (CLKBD) without change in response to an inversion signal of at least one of the control signals (CON, CONB). The transfer gate T4 may receive the control signal (CONB) through the NMOS gate, and may receive the other control signal (CON) through the PMOS gate.

Therefore, if the control signal (CON) is at a low level, the transfer gate T4 may be turned on. If the control signal (CON) is at a high level, the transfer gate T4 may be turned off.

For example, if the control signal (CON) is at a high level and the control signal (CONB) is at a low level, the transfer gate T3 may be turned on and the transfer gate T4 may be turned off. In contrast, if the control signal (CON) is at a low level and the control signal (CONB) is at a high level, the transfer gate T4 may be turned on and the transfer gate T3 may be turned off.

In addition, the control signal generator 330 may output the control signals (CON, CONB) for controlling the transfer gates (T1~T4) in response to one or more of the clock signals (CLK, CLKB) and, in one example, the test signal (TM).

As described above, if the control signal (CON) is at a high level and the control signal (CONB) is at a low level, the transfer gates (T1, T3) may be turned on. Thus, the flip-flop 100 may operate by the delay clock signals (CLKD, CLKBD) obtained by inverting the phases of the clock signals (CLK, CLKB). Therefore, the flip-flop 100 may be synchronized with a falling edge of the clock signal (CLK) such that the flip-flop 100 may trigger data (DATA).

In contrast, if the control signal (CON) is at a low level and the control signal (CONB) is at a high level, the transfer gates (T2, T4) may be turned on. As a result, the flip-flop 100 may operate by the delay clock signals (CLKD, CLKBD) obtained by bypassing the phases of the clock signals (CLK, CLKB) without change. Therefore, the flip-flop 100 may be synchronized with the rising edge of the clock signal (CLK) such that the flip-flop 100 may trigger data (DATA).

The above-mentioned embodiment may switch the clock (CLK) triggering scheme through the switching states of the trigger controllers (310, 320), such that the clock (CLK) triggering can be triggered at the rising or falling edge through the switching states of the trigger controllers (310, 320).

Figure 9:
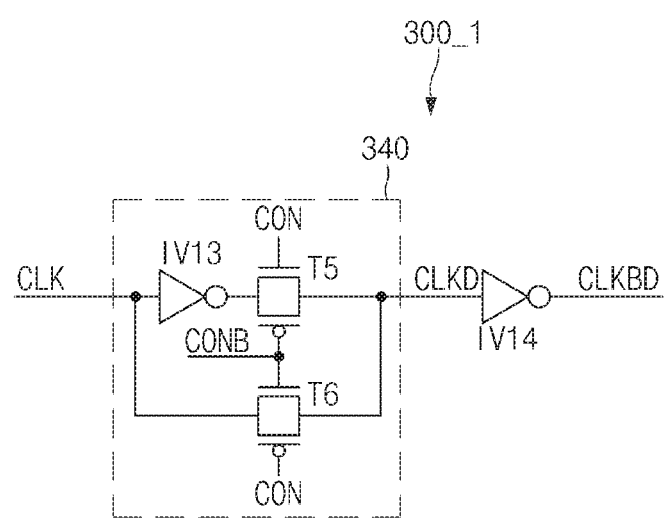
FIG. 9 is a circuit diagram illustrating a clock controller shown in FIG. 7 according to another embodiment of the present disclosure.

FIG. 9 is a circuit diagram illustrating the clock controller 200 shown in FIG. 7 according to another embodiment of the present disclosure. The clock control unit 300 shown in FIG. 9 may be denoted by a reference numeral (300_1). The control signal generator 330 for generating the control signals (CON, CONB) in FIG. 9 is identical to that of FIG. 8.

The clock controller (300_1) may include a trigger controller 340 and an inverter IV14. In this case, the trigger controller 340 may include an inverter IV13 and transfer gates (T5, T6). The transfer gate T5 and the transfer gate T6 may operate in a complementary manner.

The inverter IV13 may inversion-drive the clock signal (CLK) to invert the clock signal (CLK), and thus output the inversion-driven result to the transfer gate T5.

The transfer gate T5 may be switched by the control signals (CON, CONB), such that the output signal of the inverter IV13 may be output as the delay clock signal (CLKD) in response to at least one of the control signals (CON, CONB). In this case, the transfer gate T5 may receive the control signal (CON) through an NMOS gate, and may receive the control signal (CONB) through a PMOS gate.

In addition, the transfer gate T6 may be switched by the control signals (CON, CON B), and the transfer gate T6 may output the clock signal (CLK) as the delay clock signal (CLKD) without change in response to an inversion signal of at least one of the control signals (CON, CONB). The transfer gate T6 may receive the control signal (CONB) through the NMOS gate, and may receive the other control signal (CON) through the PMOS gate.

For example, if the control signal (CON) is at a high level and the control signal (CONB) is at a low level, the transfer gate T5 may be turned on and the transfer gate T6 may be turned off. In contrast, if the control signal (CON) is at a low level and the control signal (CONB) is at a high level, the transfer gate T6 may be turned on and the transfer gate T5 may be turned off.

The inverter IV14 may inversion-drive the clock signal (CLKD), and output the delay clock signal (CLKBD) by inverting a phase of the trigger controller 340.

As described above, if the control signal (CON) is at a high level and the control signal (CONB) is at a low level, the transfer gate T5 may be turned on, such that the delay clock signal (CLKD) obtained by inverting the phase of the clock signal (CLK) is output. Thus, the flip-flop 100 may operate by the delay clock signal (CLKBD) obtained by inverting a phase of the clock signal (CLKBD). Therefore, the flip-flop 100 may be synchronized with the falling edge of the clock signal (CLK) such that the flip-flop 100 may trigger data (DATA).

In contrast, if the control signal (CON) is at a low level and the control signal (CONB) is at a high level, the transfer gate T6 may be turned on, such that the delay clock signal (CLKD) obtained by bypassing the phase of the clock signal (CLK) without change is output. As a result, the flip-flop 100 may operate by the delay clock signal (CLKBD) obtained by inverting the phase of the delay clock signal (CLKD). Therefore, the flip-flop 100 may be synchronized with the rising edge of the clock signal (CLK) such that the flip-flop 100 may trigger data (DATA).

The above-mentioned embodiment may switch the clock (CLK) triggering scheme through the switching state of the trigger controller 340 in such a manner that the clock (CLK) triggering is triggered at the rising or falling edge, such that the desired data can be triggered.

As described above, although a skew between the data (DATA) and the clock signal (CLK) occurs, the flip-flop 100 controls the data (DATA) to be triggered at the falling edge of the clock signal (CLK). In this case, the embodiments of the present disclosure can ensure a timing margin in a circuit design process, and can reduce a skew of the clock signal (CLK) upon completion of the chip layout.

As is apparent from the above description, the clock control device according to the embodiments accurately controls a trigger time of data such that the clock control device can reduce a skew of clock and data.

The clock control device discussed above (see FIGS. 1-9) are particular useful in the design of memory devices, processors, and computer systems. For example, referring to FIG. 10, a block diagram of a system employing a clock control device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one clock control device as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, one or more of the processor 1100, chipset 1150, memory devices 1350 and the memory controller 1200 may include a clock control device as discussed above with relation to FIGS. 1-9. The memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a system 1000 employing a clock controller as discussed above with relation to FIGS. 1-9. In alternate embodiments, such as, for example but not limited to, cellular phones or digital cameras, the components may differ from the embodiments illustrated in FIG. 10.

Figure 10:
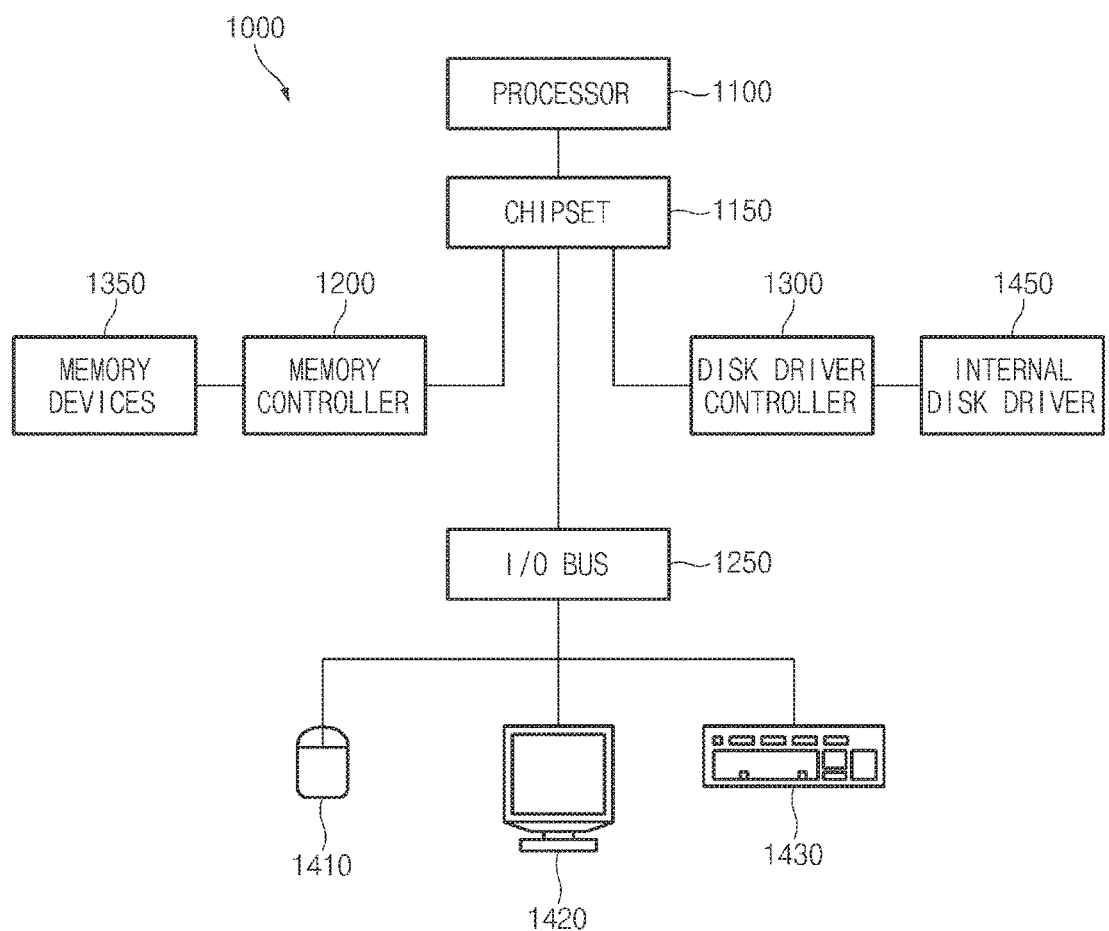
FIG. 10 illustrates a block diagram of an example of a representation of a system employing a semiconductor device in accordance with the various embodiments discussed above with relation to FIGS. 1-9.

FIG. 10 illustrates a block diagram of an example of a representation of a system employing a clock controller in accordance with the various embodiments discussed above with relation to FIGS. 1-9.

Those skilled in the art will appreciate that embodiments may be carried out in other specific ways than those set forth herein without departing from the spirit and essential characteristics of the disclosure. The above embodiments are therefore to be construed in all aspects as illustrative and not restrictive. The scope of embodiments should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A clock control device comprising:
    a flip-flop configured to latch data in response to a delay clock signal; and
    a clock controller configured to output the delay clock signal by delaying a clock signal, and control the data in response to a test signal in a manner that the data is triggered at the rising or falling edge of the clock signal,
    wherein the clock controller includes:
        a first trigger controller configured to output a first delay clock signal by inverting a phase of a first clock signal or bypass the phase of the first clock signal and output the bypassed result as the first delay clock signal in response to a control signal;
        a second trigger controller configured to output a second delay clock signal by inverting a phase of a second clock signal or bypass the phase of the second clock signal and output the bypassed result as the second delay clock signal in response to the control signal; and
        a control signal generator configured to generate the control signal in response to the test signal.

2. The clock control device according to claim 1, wherein the flip-flop includes:
    a first inverter configured to invert the data when the delay clock signal is at a low level;
    a first latch unit configured to latch an output signal of the first inverter;
    a second inverter configured to invert an output signal of the first latch unit when the delay clock signal is at a high level; and
    a second latch unit configured to latch an output signal of the second inverter.

3. The clock control device according to claim 1, wherein the second clock signal is an inversion signal of the first clock signal.

4. The clock control device according to claim 1, wherein the second delay clock signal is an inversion signal of the first delay clock signal.

5. The clock control device according to claim 1, wherein the first trigger controller includes:
    a third inverter configured to invert the first clock signal;
    a first transfer gate configured to output an output signal of the third inverter as the first delay clock signal in response to the control signal; and
    a second transfer gate configured to output the first clock signal as the first delay clock signal in response to an inversion signal of the control signal.

6. The clock control device according to claim 1, wherein the second trigger controller includes:
    a fourth inverter configured to invert the second clock signal;
    a third transfer gate configured to output an output signal of the fourth inverter as the second delay clock signal in response to the control signal; and
    a fourth transfer gate configured to output the second clock signal as the second delay clock signal in response to an inversion signal of the control signal.

7. The clock control device according to claim 6, wherein:
    the third transfer gate is turned on and the fourth transfer gate is turned off in response to the control signal and the inversion signal of the control signal.

8. The clock control device according to claim 1, wherein the clock controller includes:
    a third trigger controller configured to output a third delay clock signal by inverting a phase of the clock signal or bypass the phase of the clock signal and output the bypassed result as the third delay clock signal; and
    a fifth inverter configured to output a fourth delay clock signal by inverting a phase of an output signal of the third trigger controller.

9. The clock control device according to claim 8, wherein the third trigger controller includes:
    a sixth inverter configured to invert the clock signal;
    a fifth transfer gate configured to output an output signal of the sixth inverter as the third delay clock signal in response to the control signal; and a sixth transfer gate configured to output the clock signal as the third delay clock signal in response to an inversion signal of the control signal.

* * * * *